(12) United States Patent
Choi et al.

(10) Patent No.: US 7,283,413 B2
(45) Date of Patent: Oct. 16, 2007

(54) SENSE AMPLIFIER AND METHOD FOR GENERATING VARIABLE REFERENCE LEVEL

(75) Inventors: Jeong-Un Choi, Yongin-si (KR); Sang-Won Kim, Seoul (KR); Hong-Seok Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 198 days.

(21) Appl. No.: 11/076,788

(22) Filed: Mar. 9, 2005

(65) Prior Publication Data

US 2005/0201171 A1  Sep. 15, 2005

(30) Foreign Application Priority Data

Mar. 10, 2004 (KR) .................. 10-2004-0016253
Jul. 20, 2004 (KR) .................. 10-2004-0056509

(51) Int. Cl.
*G11C 7/00* (2006.01)

(52) U.S. Cl. ............... 365/205; 365/189.09; 365/226

(58) Field of Classification Search ............. 365/205, 365/207, 189.09, 189.07, 226, 210
See application file for complete search history.

(56) References Cited

U.S. PATENT DOCUMENTS

| | | | |
|---|---|---|---|
| 4,802,166 A * | 1/1989 | Casagrande et al. | 714/721 |
| 6,084,797 A | 7/2000 | Maloberti et al. | 365/185.03 |
| 6,392,916 B1 | 5/2002 | Choi et al. | 365/145 |
| 6,407,943 B1 | 6/2002 | Choi et al. | 365/145 |
| 6,493,266 B1 * | 12/2002 | Yachareni et al. | 365/185.22 |
| 6,785,163 B2 * | 8/2004 | Yeh et al. | 365/185.2 |
| 7,075,844 B2 * | 7/2006 | Pagliato et al. | 365/207 |

FOREIGN PATENT DOCUMENTS

| | | |
|---|---|---|
| JP | 9-069293 | 3/1997 |
| JP | 01-135074 | 5/2001 |
| KR | 98-046509 | 9/1998 |
| KR | 10-2001-0065281 | 7/2001 |
| KR | 02-55937 | 7/2002 |
| KR | 10-0344832 | 7/2002 |
| KR | 10-0359854 | 10/2002 |
| KR | 10-0373854 | 2/2003 |
| KR | 04-08736 | 1/2004 |

* cited by examiner

Primary Examiner—Gene N. Auduong
(74) Attorney, Agent, or Firm—Mills & Onello LLP

(57) ABSTRACT

In a sense amplifier and method of generating a variable reference level, the sense amplifier varies a reference voltage level in accordance with variation of a operating voltage. This ensures that on-cell and off-cell margins required to detect data are sufficiently maintained regardless of the variation of the operating voltage in the semiconductor memory device. Read failures that otherwise would be generated due to insufficient voltage sensing margin are thus avoided.

34 Claims, 15 Drawing Sheets

SENSE AMPLIFIER AND METHOD FOR GENERATING VARIABLE REFERENCE LEVEL

CROSS-REFERENCE TO RELATED APPLICATIONS

This U.S. non-provisional patent application claims priority under 35 U.S.C. § 119 of Korean Patent Applications 2004-16253 filed on Mar. 10, 2004, and 2004-56509 filed on Jul. 20, 2004, the entire contents of each of which are hereby incorporated by reference.

BACKGROUND OF THE INVENTION

The present invention is related to sense amplifiers of semiconductor memory devices, and, in particular, to a sense amplifier and method of varying a reference level in a sense amplifier to be used for detecting data.

With the continued trend toward increased memory capacity, failures in reading data can occur due to relatively weak data signals and long delay times before bit line voltages swing to stable levels. For this reason, it is common for memory devices to employ sense amplifiers for amplifying the signal levels of data so as to provide more stable read operations, while requiring lower power levels by reducing the delay times of bit lines. An example technique for reading data by means of a sense amplifier is disclosed in U.S. Pat. No. 6,084,797, entitled "Method for reading a multi-level memory cell", issued on Jul. 4, 2000 to Maloberti.

In general, a sense amplifier compares a core cell current Ic, that is detected from a core cell, with a reference cell current Ir that has a predetermined level during a read operation for the core cell. According to the comparison result, it is determined whether the sensed core cell is an on-cell or an off-cell. For example, if the core cell current Ic is less than the reference cell current Ir, the core cell is regarded as an off-cell D0. If the core cell current Ic is larger than the reference cell current Ir, the core cell is regarded as an on-cell D1. During this determination, the variations of core cell currents (Ion and Ioff; i.e., on-cell current and off-cell current) and a reference current (Iref; i.e., the reference cell current Ir), Ic and Ir, can be determined as follows, as a function of variation in power supply voltage.

FIG. 1 is a graphic diagram that demonstrates variation of the reference current and the core cell current as a function of varying power supply voltage in a semiconductor memory device.

As illustrated in FIG. 1, when a core cell is in an off-state (D0), a core cell off-current Ioff becomes smaller than the reference cell current Iref. However, the difference between the cell current and the reference current Iref is gradually reduced when a high power supply voltage is applied to the circuit based on the electrical characteristic of the core cell (refer to the shaded portion of the arrow 1 in FIG. 1). The core cell off-current Ioff is insufficient to enable a read operation by the sense amplifier due to the shortness of the sensing margin in comparison with the reference voltage Iref in the environment of high voltage HVcc. Otherwise, while the core cell on-current Ion is larger than the reference current Iref when the core cell is conditioned in an on-state (D1), the marginal difference from the reference current Iref is reduced at a low voltage condition LVcc by the electrical characteristic of the core cell (refer to the shaded portion of the arrow 2 in FIG. 1). Also, in this case, it is difficult for the sense amplifier to detect the on-state of the core cell.

SUMMARY OF THE INVENTION

The present invention is directed to a sense amplifier and method which prevent reading failures due to reduced marginal voltage, by assuring sufficient on-cell and off-cell margins in identifying valid data from varying a reference cell level (e.g., a reference cell current or a reference cell voltage) with variation in operating voltage.

In one aspect, the present invention is directed to a sense amplifier of a semiconductor memory device, comprising: a reference cell level control unit that varies a reference cell level used for identifying data in accordance with a varying of a power source voltage of the semiconductor memory device, ensuring sufficient on-cell and off-cell margins for identifying data regardless of the varying power source voltage; a core cell level detector that senses a core cell level of the semiconductor memory device; and a comparator that identifies data stored in the core cell by comparing the core cell level with the reference cell level.

In one embodiment, the reference cell control unit comprises: a reference level controller generating a plurality of reference level control voltages in response to a comparing voltage and a plurality of voltages divided from the power source voltage according to predetermined resistance ratios; and a reference level generator selectively switching a plurality of reference currents in response to the plurality of reference level control voltages and generating a reference cell current in response to a sum of the reference currents.

In another embodiment, the reference cell control unit reduces the reference cell current to increase a gap between the reference cell current and an on-cell current when the power source voltage decreases below the comparing voltage, and increases the reference cell current to increase a gap between the reference cell current and an off-cell current when the power source voltage rises above the comparing voltage.

In another embodiment, the reference level controller comprises; a comprising voltage generator outputting the comparing voltage at a constant level derived from the varying power source voltage; a voltage divider providing the plurality of divided voltages according to the predetermined resistance ratios from the varying power source voltage by means of plural resistors connected between the power source voltage and a ground; and a control voltage generator outputting each of the plurality of reference level control voltages when the corresponding divided voltage is higher than the comparing voltage.

In another embodiment, the control voltage generator comprises a plurality of comparing units for comparing the divided voltages with the comparing voltage.

In another embodiment, the control voltage generator increases the number of activated reference level control voltages when the divided voltage is higher than the comparing voltage, and decreases the number of activated reference level control voltages when the divided voltage is lower than the comparing voltage.

In another embodiment, the reference level generator comprises: a reference current generating unit generating a first reference current used as a reference in generating the reference cell current; a switching unit selectively outputting a plurality of second reference currents, that are used for varying the reference cell current, in response to the plurality of reference level control voltages supplied from the reference level controller; and a reference level output unit providing a sum of the first and second reference currents as the reference cell level to the comparator.

In another embodiment, the first reference current and each of the plurality of second reference currents have the same level as each other.

In another embodiment, the switching unit comprises a plurality of switching transistors selectively driving plurality of the second reference currents in response to the plurality of reference level control voltages.

In another embodiment, each of the switching transistors has the same operation characteristic as the core cell of the semiconductor memory device.

In another embodiment, each of the switching transistors is one of NMOS and PMOS transistors.

In another embodiment, the switching transistors are flash memory cell transistors.

In another embodiment, the reference cell level control unit comprises: a reference level controller generating a plurality of reference level control voltages in response to a comparing voltage and plurality of voltages divided from the power source voltage according to predetermined resistance ratios; and a reference level generator selectively connecting a plurality of resistors in response to the plurality of reference level control voltages and generating a reference cell voltage by dividing the power source voltage by the combined resistance value of the resistors that are selectively connected.

In another embodiment, the reference cell control unit reduces the reference cell voltage to increase a gap between the reference cell current and an on-cell current when the power source voltage decreases below the comparing voltage, and increases the reference cell voltage to increase a gap between the reference cell current and an off-cell current when the power source voltage rises above the comparing voltage.

In another embodiment, the reference level controller comprises: a comparing voltage generator outputting the comparing voltage at a constant level derived from the varying power source voltage; a voltage divider providing the plurality of divided voltages according to the predetermined resistance ratios from the varying power source voltage by means of plural resistors connected between the power source voltage and a ground; and a control voltage generator outputting each of the plurality of reference level control voltages when the corresponding divided voltage is higher than the comparing voltage.

In another embodiment, the control voltage generator comprises a plurality of comparing units for comparing the divided voltages with the comparing voltage.

In another embodiment, the control voltage generator increases the number of activated reference level control voltages when the divided voltage is higher than the comparing voltage, and decreases the number of activated reference level control voltages when the divided voltage is lower than the comparing voltage.

In another embodiment, the reference level generator comprises: a reference voltage generating unit including a first output resistor; and a switching unit selectively connecting plural second output resistors in parallel with the first output resistor in response to the plurality of reference level control voltages supplied from the reference level controller, wherein the reference cell voltage is generated by dividing the power source voltage with the combined resistance value of the first output resistor and the plurality of active second output resistors.

In another embodiment, the switching unit comprises a plurality of switching transistors selectively connecting the plurality of second output resistors in parallel with the first output resistor in response to the plurality of reference level control voltages.

In another embodiment, each of the switching transistors has the same operation characteristic as the core cell of the semiconductor memory device.

In another embodiment, each of the switching transistors is one of NMOS and PMOS transistors.

In another embodiment, the switching transistors are flash memory cell transistors.

In another aspect, the present invention is directed to a method of sensing data in a semiconductor memory device, comprising the steps of: (a) varying a reference cell level to be used for identifying data in accordance with a varying power source voltage of the semiconductor memory device, to ensure sufficient on-cell and off-cell margins for identifying data regardless of the varying power source voltage; (b) sensing a core cell level of the semiconductor memory device; and (c) identifying data stored in the core cell by comparing the core cell level with the reference cell level.

In one embodiment, the step (a) comprises the steps of: (a-1) generating a comparing voltage at a constant level from the varying power source voltage; (a-2) comparing voltages, which are obtained by dividing the power source voltage according to predetermined resistance ratios by a plurality of resistors, with the comparing voltage and generating a plurality of reference level control voltages in response to the comparing result; (a-3) switching a plurality of reference currents in response to the plurality of reference level control voltages; and (a-4) generating a reference cell current in response to a combination of the switched reference currents.

In another embodiment, in the step (a-3), the number of activated reference currents decreases when the power source voltage decreases below the comparing voltage, while the number of activated reference currents increases when the power source voltage rises above the comparing voltage.

In another embodiment, in the step (a-3), the switched reference current is generated from a transistor that has the same operating characteristic as that of the core cell.

In another embodiment, in the step (a), a reference cell current decreases to increase a gap between the reference cell current and an on-cell current when the power source voltage decreases below the comparing voltage, and the reference cell current increases to increase a gap between the reference cell current and an off-cell current when the power source voltage rises above the comparing voltage.

In another embodiment, the step (a) comprises the steps of: (a-1) generating a comparing voltage at a constant level from the varying power source voltage; (a-2) dividing the power source voltage into divided voltages using predetermined resistance ratios by a plurality of resistors; (a-3) comparing the divided voltages with the comparing voltage and generating a plurality of reference level control voltages in response to the comparing result; (a-4) selectively connecting a plurality of output resistors in response to the plurality of reference level control voltages; and (a-5) generating a reference cell current by dividing the power source voltage by the combined resistance ratio of the output resistors.

In another embodiment, in the step (a-4), the combined resistance of the output resistors increases when the power source voltage decreases below the comparing voltage, and the combined resistance of the output resistor decreases when the power source voltage increases above the comparing voltage.

In another embodiment, in the step (a), a reference cell voltage decreases to increase a gap between the reference cell voltage and an on-cell current when the power source voltage decreases below the comparing voltage, while increases to increase a gap between the reference cell voltage and an off-cell current when the power source voltage rises above the comparing voltage.

In another aspect, the present invention is directed to a method of generating a reference level to identify data stored in a core cell of a semiconductor memory device by comparing a reference cell current with a core cell current, the method comprising the steps of: (a) generating a plurality of reference level control voltages in response to a comparing voltage generated from a power source voltage of the semiconductor memory device and voltages divided from the power source voltage according to predetermined resistance ratios; and (b) switching a plurality of reference currents in response to the reference level control voltages and generating the reference cell current in response to a combination of the switched reference currents.

In another aspect, the present invention is directed to a method of generating a reference level to identify data stored in a core cell of a semiconductor memory device by comparing a reference cell voltage with a core cell voltage, the method comprising the steps of: (a) generating a plurality of reference level control voltages in response to a comparing voltage generated from a power source voltage of the semiconductor memory device and voltages divided from the power source voltage according to predetermined resistance ratios; and (b) adjusting a resistance value of an output resistor in response to the reference level control voltages and generating the reference cell voltage in response to the adjusted resistance value.

In another aspect, the present invention is directed to a method of generating a reference level to identify data stored in a core cell of a semiconductor memory device by comparing a reference cell current with a core cell current, the method comprising the steps of: (a) generating a comparing voltage at a constant level from a varying power source voltage of the semiconductor memory device; (b) dividing the power source voltage according to predetermined resistance ratios by a plurality of resistors, and generating a plurality of reference level control voltages in response to the comparing voltage and the divided voltages; (c) switching a plurality of reference currents in response to the reference level control voltages; and (d) generating the reference cell current in response to a combination of the switched reference currents.

In another aspect, the present invention is directed to a method of generating a reference level to identify data stored in a core cell of a semiconductor memory device by comparing a reference cell voltage with a core cell voltage, the method comprising the steps of: (a) generating a comparing voltage at a constant level from a varying power source voltage of the semiconductor memory device; (b) dividing the power source voltage according to predetermined resistance ratios by a plurality of resistors, and generating a plurality of reference level control voltages in response to the comparing voltage and the divided voltages; (c) selectively connecting a plurality of output resistors in response to the reference level control voltages; and (d) generating the reference cell voltage by dividing the power source voltage by the combined resistance of the output resistors.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, an exemplary embodiment of the present invention will be described in conjunction with the accompanying drawings.

A sense amplifier of the present invention varies a reference cell level (e.g., a reference cell current or a reference cell voltage) on the basis of a voltage that is divided from a power source, or power supply, voltage of a semiconductor memory device and a predetermined comparing voltage that is generated internally. As a result, an on-cell margin is sufficiently obtained by a lower level of the reference cell in a condition of low power supply voltage, while an off-cell margin is sufficiently obtained by a higher level the reference cell in a condition of high power supply voltage.

Figure 1:
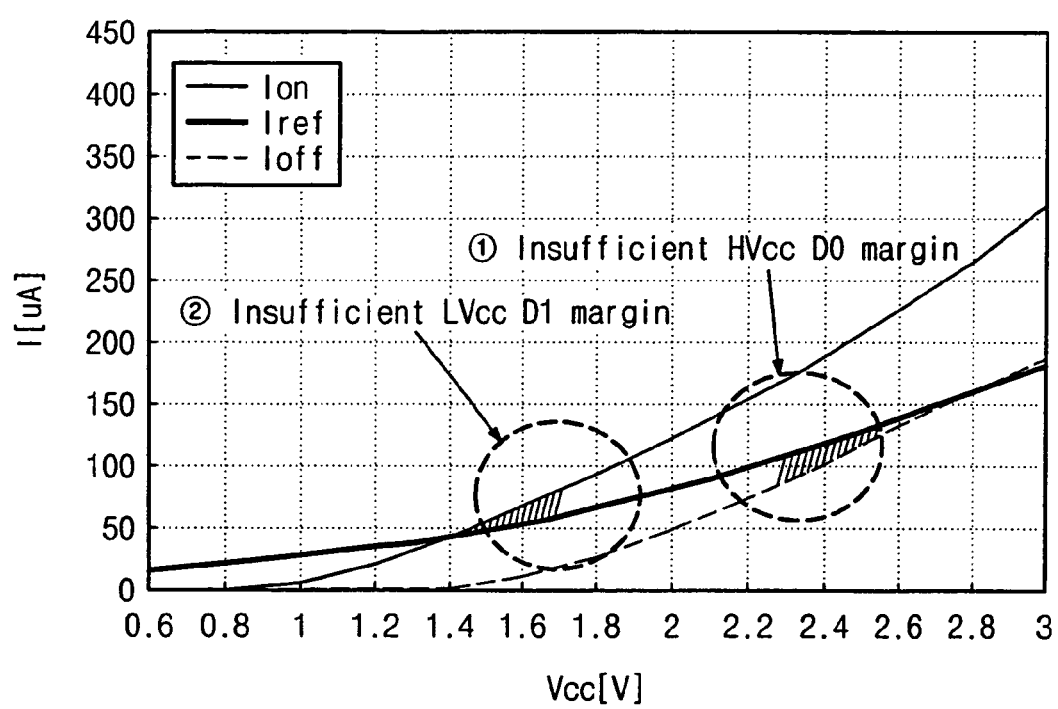
FIG. 1 is a graph illustrating variation of a reference current and a core cell current as a function of varying power supply voltage in a semiconductor memory device.
Figure 2:
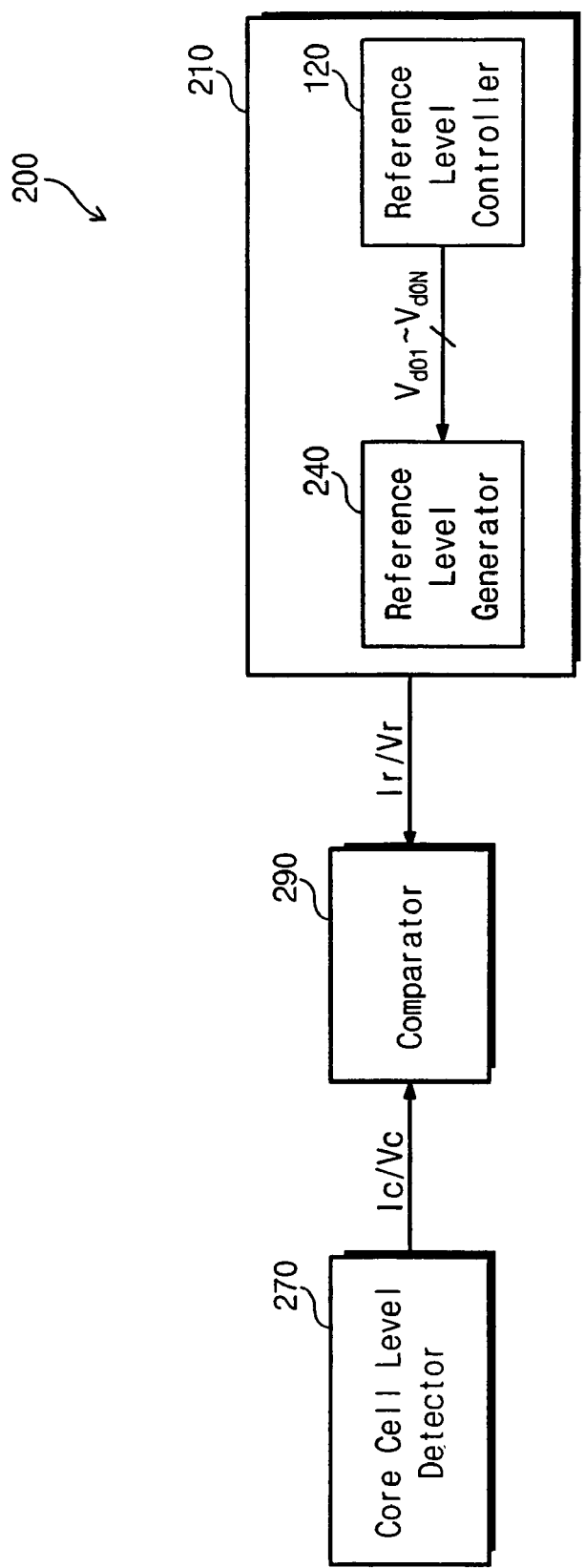
FIG. 2 is a block diagram of a sense amplifier according to the present invention.

FIG. 2 is a block diagram of a sense amplifier according to a preferred embodiment of the present invention.

Referring to FIG. 2, the sense amplifier 200 of the invention is comprised of a reference cell level control unit 210, a core cell level detector 270, and a comparator 290. The reference cell level control unit 210 outputs the reference level (the reference cell current Ir or the reference cell voltage Vr) to the comparator 290 with reference to voltages, Vr12, Vr23, ..., that are divided from the power source voltage Vcc of the semiconductor memory device and the comparing voltage Vcomp generated internally. The core cell level detector 270 senses a core cell level (a core cell current Ic or a core cell voltage Vc) from a core cell of the semiconductor memory device and then outputs the sensed core cell level to the comparator 290. The comparator 290 identifies data stored in the core cell by comparing the core cell level, Ic or Vc, which is supplied from the reference cell level control unit 210, with the reference cell level, Ir or Vr, which is supplied from the core cell level detector 270.

The reference cell level converter 210 includes a reference level controller 120 and a reference level generator 240. The reference level controller 120 compares the voltages Vr12, Vr23, ..., that are divided from the power source voltage Vcc, with the comparing voltage Vcomp having a predetermined level. As a result of the comparison, a plurality of reference level control voltages $V_{do1} \sim V_{doN}$ are generated. The reference level controller 120 generates the reference level Ir or Vr by switching a current or a voltage in response to the plural reference level control voltages $V_{do1} \sim V_{doN}$.

When the power source voltage Vcc becomes less than the comparing voltage Vcomp, the reference level Ir or Vr becomes lower, thereby increasing the gap from the on-cell level. Otherwise, when the power source voltage Vc becomes greater than the comparing voltage Vcomp, the reference level Ir or Vr becomes higher, thereby increasing the gap from the off-cell level. As a result, margins for sensing the on-cell and off-cell level are sufficiently obtained to properly identify valid data, thereby preventing a read failure that otherwise would occur due to shortness in the voltage margin.

Figure 3:
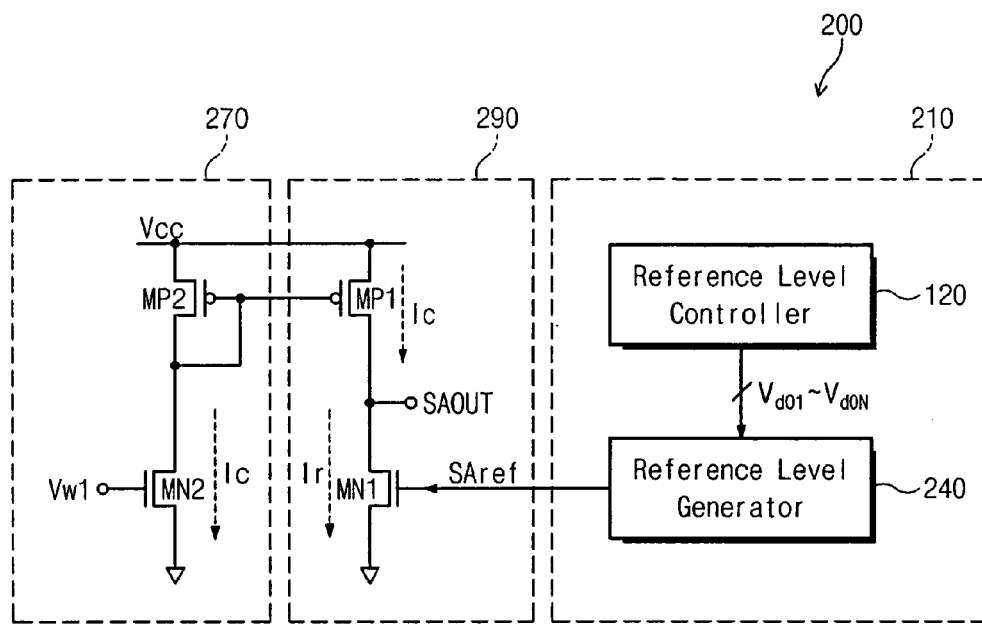
FIGS. 3 through 6 are circuit diagrams illustrating a sense amplifier, a core cell level detector and a comparator which are included in the sense amplifier, in accordance with the present invention.

FIG. 3 illustrates circuits of the sense amplifier 200, and the core cell level detector 270 and the comparator 290 which are included in the sense amplifier 200, according to a preferred embodiment of the invention. FIG. 3 exemplarily shows a circuit construction when the reference cell current Ir is varied.

Referring to FIG. 3, the comparator 290 is comprised of a first PMOS transistor MP1 and a first NMOS transistor MN1 current paths of which are connected between the power source voltage Vcc and a ground in series. Between the first PMOS and NMOS transistors, MP1 and MN1, is disposed an output node SAOUT.

The first PMOS transistor MP1 charges the output node SAOUT in response to the core cell current Ic supplied from the core cell level detector 270 through a control terminal (i.e., its gate electrode). The first NMOS transistor MN1 discharges the output node SAOUT in response to the reference cell current Ir supplied from the reference cell level control unit 210 through a control terminal (i.e., its gate electrode). The output signal at the output node SAOUT, is a result of charging and discharging using the core cell current Ic and the reference cell current Ir each by the first PMOS and NMOS transistors, MP1 and MN1, as identified data for a core cell. In other words, the comparator 290 conducts the operation of comparing the core cell current Ic flowing through the first PMOS transistor MP1 with the reference cell current Ir flowing through the first NMOS transistor MN1. As a result of the comparison result thereof, the core cell is identified as being in an off-state D0 when the core cell current Ic is less than the reference cell current Ir, and the core cell is identified as being in an on-state D1 when the core cell current Ic is greater than the reference cell current Ir.

The core cell level detector 270 includes second PMOS and NMOS transistors, MP2 and MN2, current paths of which are connected between the power source voltage Vcc and the ground in series.

The second NMOS transistor MN2 responds to a wordline voltage Vw1 of the memory device through a control terminal (i.e., its gate electrode) and outputs the core cell current Ic in correspondence with the wordline voltage Vw1. A gate electrode of the second PMOS transistor MP2 connected between the power source voltage Vcc and the second NMOS transistor MN2 is commonly connected to the control terminal of the first PMOS transistor MP1, forming a current mirror circuit with the first PMOS transistor MP1. By the current mirror loop, the core cell current Ic generated from the second NMOS transistor MN2 is transferred to the comparator 290. Here, although nor shown in FIG. 3, the first NMOS transistor MN1 of the comparator 290 responds to the reference cell current Ir generated from the reference level control unit 210 by way of a current mirror loop in the same manner as that of the core cell level detector 270, which will be described below in conjunction with FIG. 11.

Figure 4:
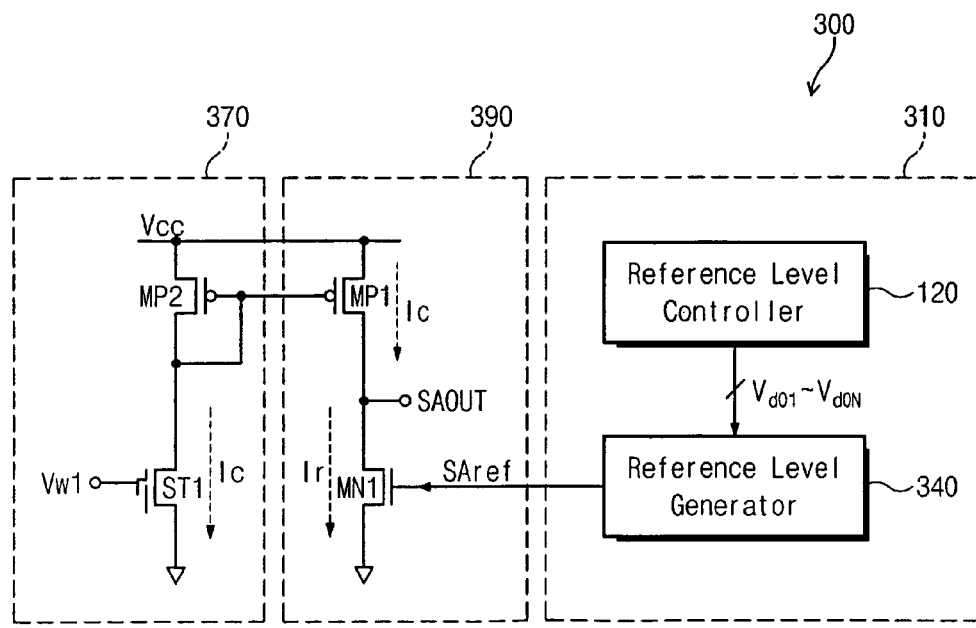

FIG. 4 illustrates circuits of a sense amplifier 300, and a core cell level detector 370 and a comparator 390 which are included in the sense amplifier 300, according to another embodiment of the invention. FIG. 4 exemplarily shows a circuit construction when the reference cell current Ir is varied.

The circuit shown in FIG. 4 is similar in structure and operation to that of FIG. 3, except that a transistor ST1 of the core cell level detector 370 is a flash memory cell type transistor.

The core cell of the semiconductor memory device may be composed of a conventional MOS transistor MN2 as illustrated in FIG. 3, or a flash memory cell transistor ST1 as illustrated in FIG. 4. In this case, the transistors constructing the core cell level detector 270 or 370 are the same as those of the core cell. As a result, it is possible to efficiently vary the reference cell current Ir, while maintaining the characteristic of the core cell in itself.

Figure 5:
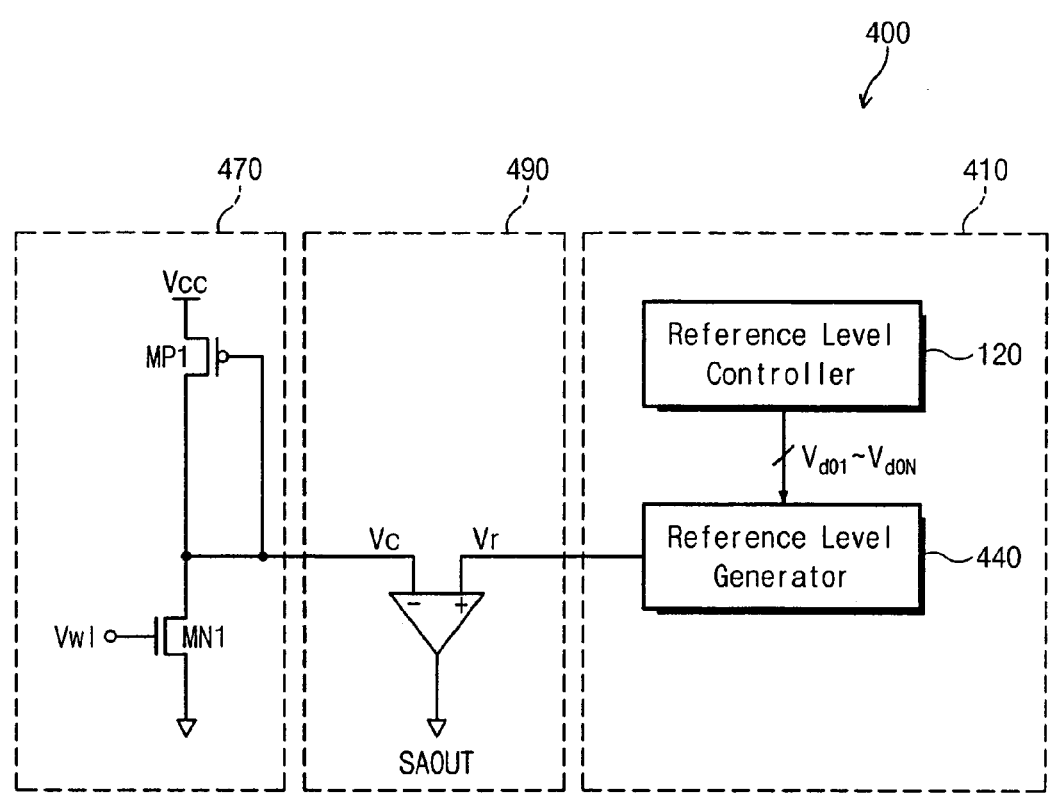

FIG. 5 illustrates circuits of a sense amplifier 400, and a core cell level detector 470 and a comparator 490 which are included in the sense amplifier 400, according to another embodiment of the invention. Also, FIG. 5 exemplarily shows a circuit construction when the reference cell voltage Vr is varied.

Referring to FIG. 5, the comparator 490 is composed of a differential amplifier with one input terminal receiving the core cell voltage Vc from the core cell level detector 470 and the other input terminal receiving the reference cell voltage Vr from a reference cell level control unit 410. The comparator 490 compares the core cell voltage Vc to the reference cell voltage Vr. If the core cell voltage Vc is higher than the reference cell voltage Vr, the output terminal SAOUT generates a value of "1" as a sensed result. If the core cell voltage Vc is lower than the reference cell voltage Vr, the output terminal SAOUT generates a value of "0" as a sensed result.

The core cell level detector 470 includes the first PMOS and NMOS transistors, MP1 and MN1, current paths of which are connected between the power source voltage Vcc and the ground in series.

The first NMOS transistor MN1 establishes the core cell voltage Vc in response to the wordline voltage Vw1 that is applied to its control terminal (i.e., gate electrode), corresponding to the wordline voltage Vw1. The current path of the first PMOS transistor MP1 is serially connected between the power source voltage Vcc and the current path of the first NMOS transistor MN1. The first PMOS transistor MP1 responds to the core cell voltage Vc through its gate electrode. Additional details will be described below with reference to FIG. 13.

Figure 6:
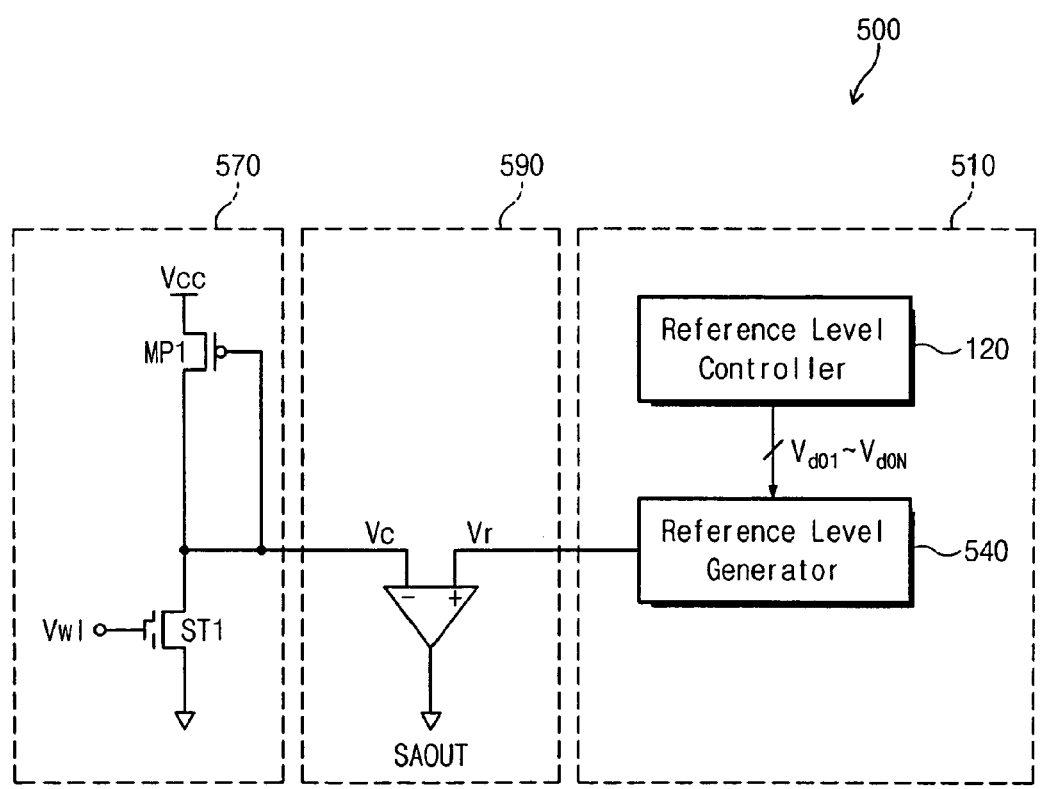

FIG. 6 illustrates circuits of a sense amplifier 500, and a core cell level detector 570 and a comparator 590 which are included in the sense amplifier 500, according to another embodiment of the invention. FIG. 6 exemplarily shows a circuit construction when the reference cell voltage Vr is varied.

The circuit shown in FIG. 6 is similar in structure and operation to that of FIG. 5, except that the transistor ST1 of the core cell level detector 570 is a flash memory cell type transistor.

The core cell of the semiconductor memory device may be composed of a conventional MOS transistor as illustrated in FIG. 5, or a flash memory cell transistor as illustrated in FIG. 6. In this case, the transistors constructing the core cell level detector 470 or 570 are the same as those of the core cell. As a result, it is possible to efficiently vary the reference cell voltage Vr, while maintaining the characteristics of the core cell in itself.

Figure 7:
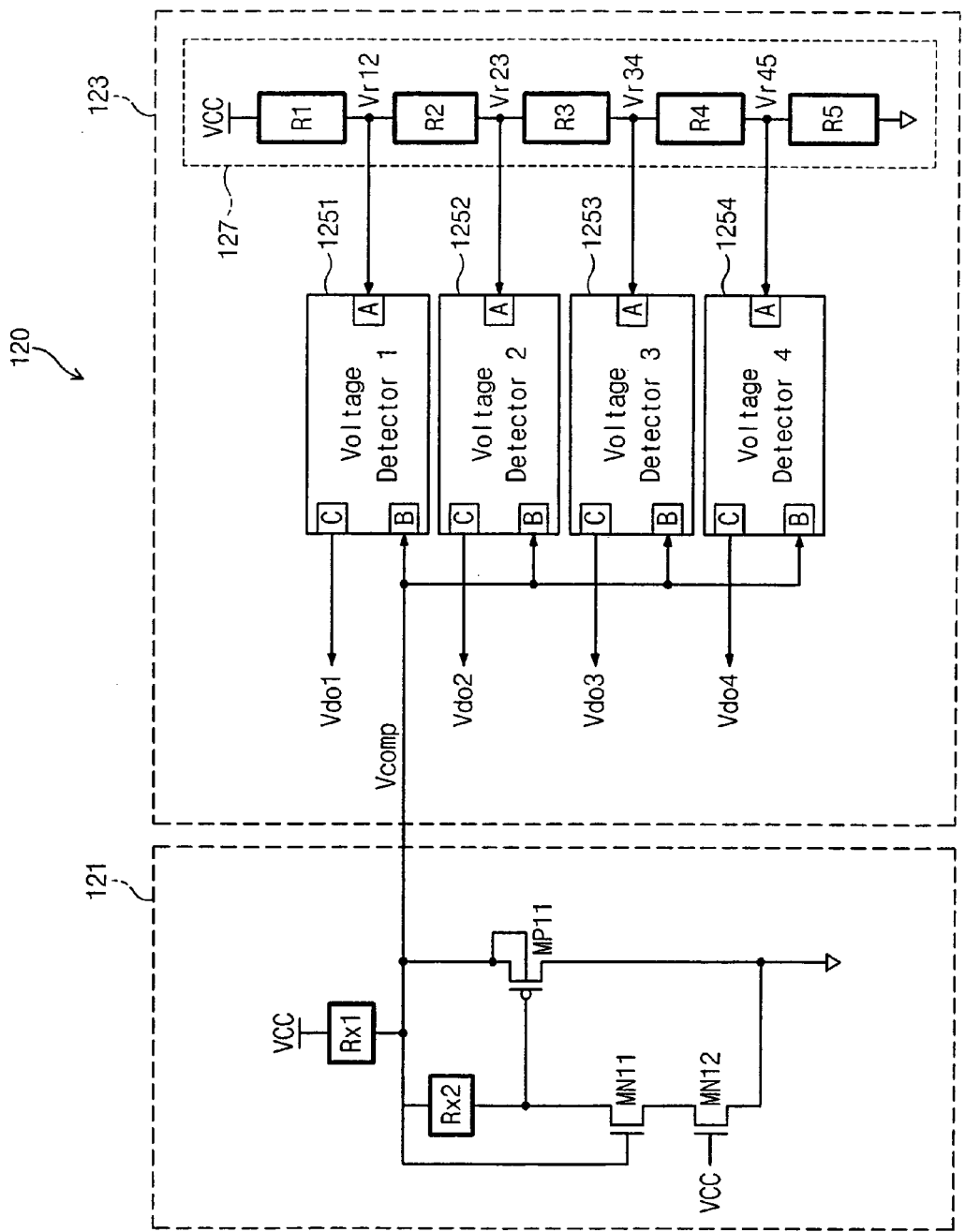
FIG. 7 is a circuit diagram illustrating the reference level controller of FIGS. 2 through 6, in accordance with the present invention

FIG. 7 is a circuit diagram illustrating the reference level controller 120 shown in FIGS. 2 through 6, as applied to adjusting levels of the reference cell current Ir and the reference cell voltage Vr.

Referring to FIG. 7, the reference level controller 120 includes a comparing voltage generator 121 and a control voltage generator 123. The comparing voltage generator 121 outputs the comparing voltage Vcomp at a constant level, and the control voltage generator 123 outputs pluralities of reference level control voltages $V_{do1}$-$V_{do4}$ to vary the level of the reference cell current Ir.

The comparing voltage generator 121 is comprised of first and second resistors Rx1 and Rx2 connected to the power source voltage Vcc in series, first and second NMOS transistors MN11 and MN12 connected between the second resistor Rx2 and the ground voltage, and a first PMOS transistor MP11 connected between a contact node of the resistors, Rx1 and Rx2, and the ground voltage. A control terminal (i.e., gate electrode) of the first PMOS transistor MP11 is coupled to a contact node between the second resistor Rx2 and the first NMOS transistor MN11. A control terminal (i.e., gate electrode) of the first NMOS transistor MN1 is coupled to the contact node between the resistors Rx1 and Rx2. A control terminal (i.e., gate electrode) of the second NMOS transistor MN12 is coupled to the power source voltage Vcc.

If the comparing voltage Vcomp is generated at a predetermined level in response to a decrease of the power source voltage level, the first NMOS transistor MN11 is turned on in response to the comparing voltage Vcomp set by the first resistor Rx1 while the second NMOS transistor MN12 is turned on in response to the reduced power source voltage Vcc. Following activation of the first and second transistors MN11 and MN12, the comparing voltage Vcomp and a voltage applied to the control terminal of the first PMOS transistor MP11 are gradually lowered along discharging operations by the first and second NMOS transistors MN11 and MN12. If the voltage applied to the first PMOS transistor MP11 becomes lower than a predetermined level, the first PMOS transistor MP11 becomes active to begin charging the comparing voltage Vcomp. In this manner, the comparing voltage Vcomp maintains a constant level, owing to the complementary charging and discharging operations, without being affected by variation in the external environment. The comparing voltage Vcomp generated by such an operation is used as a voltage establishing a reference level for an operation of the sense amplifier (i.e., a voltage referred to when regulating the level of the reference cell current).

The control voltage generator 123 is composed of plural voltage detectors 1251~1254 and a voltage divider 127. The voltage divider 127 establishes voltages Vr12~Vr45 by dividing the power source voltage Vcc, according to a predetermined ratio, with plural resistors R1~R5 serially connected between the power source voltage Vcc and ground. The voltage detectors sense the divided voltages Vr12~Vr45 set by the resistors R1~R5 and then output the reference level control voltages $V_{do1}$~$V_{do4}$ by comparing the divided voltages Vr12~Vr45 with the comparing voltage Vcomp. While FIG. 7 exemplarily shows four voltage detectors, the number of voltage detectors and resistors, and the resistance values of the resistors, and related ratios, can be modified in accordance with application requirements.

Figure 8:
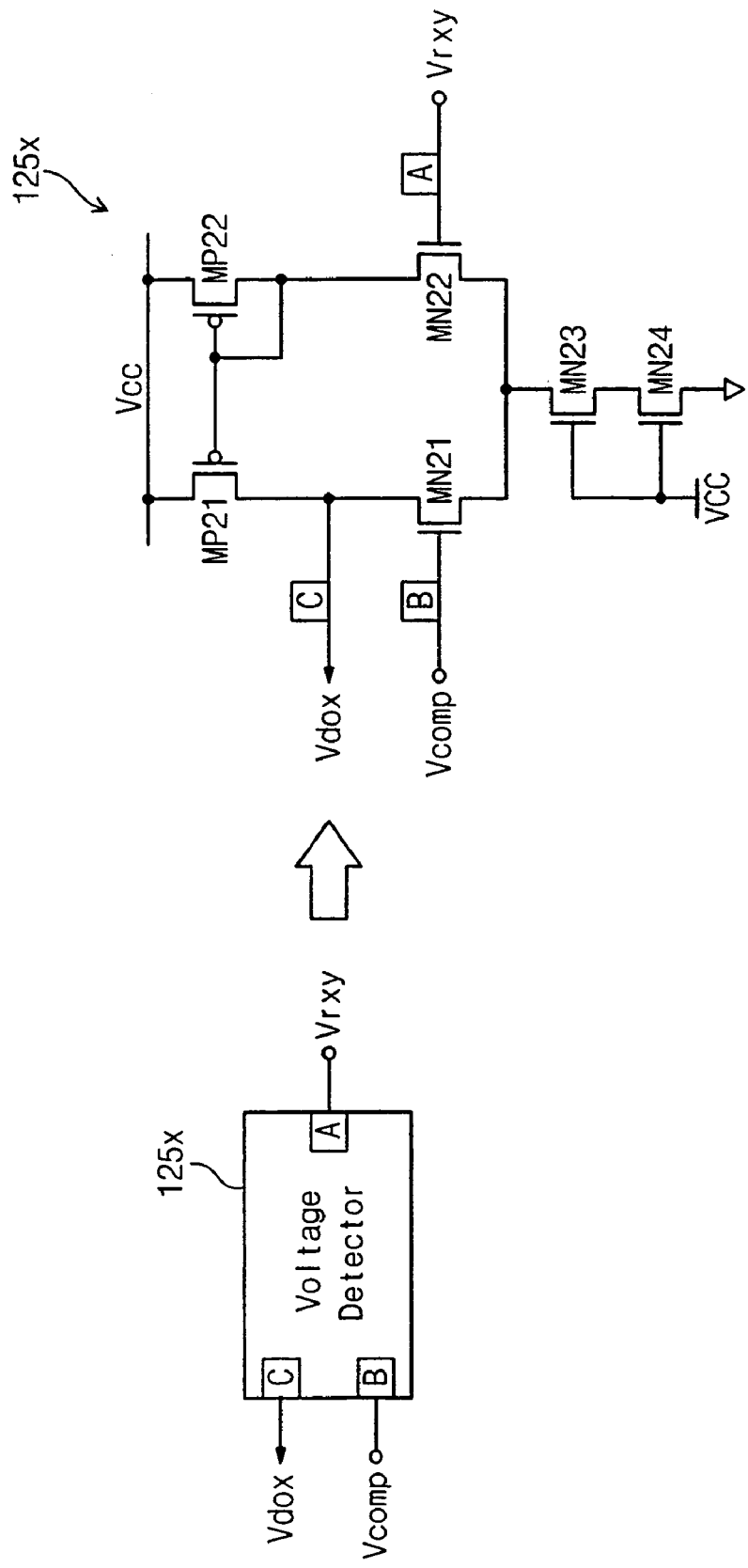
FIG. 8 is a circuit diagram of a voltage detector of FIG. 7 in accordance with the present invention.
Figure 9:
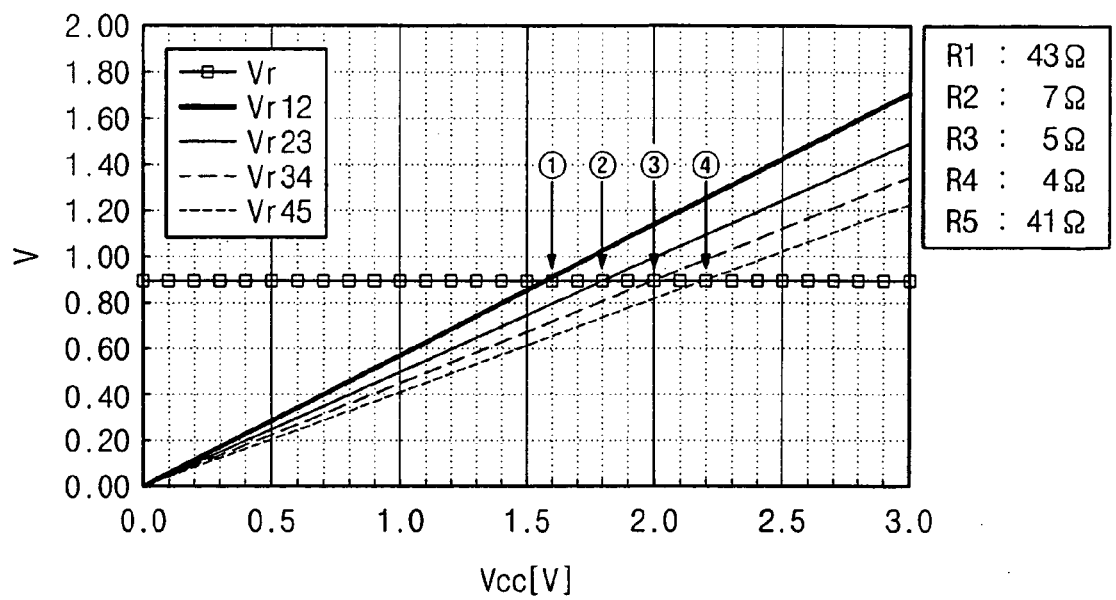
FIG. 9 is a graph that illustrates the features of a comparing voltage and voltages divided by resistors, as a function of varying power supply voltage.
Figure 10:
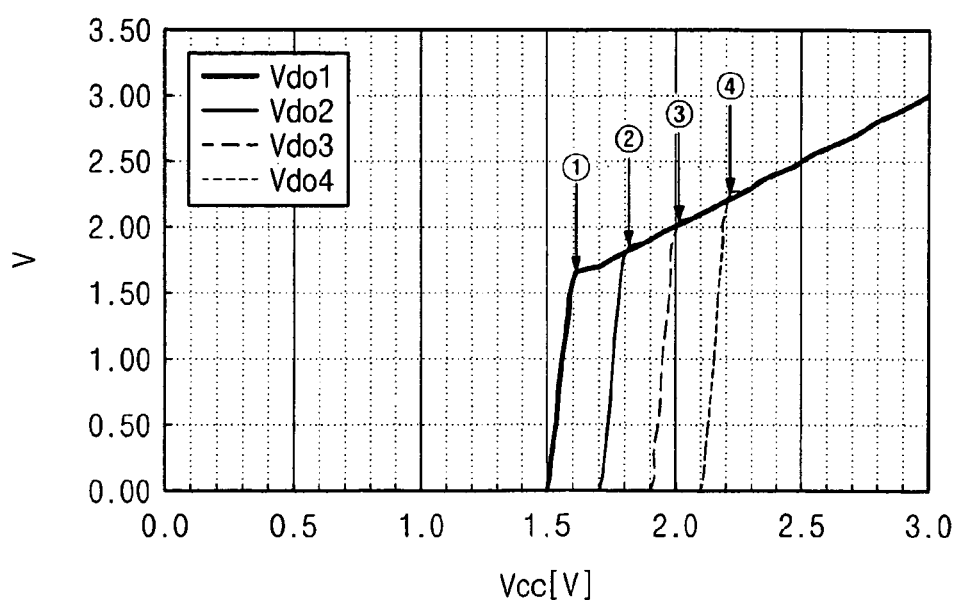
FIG. 10 is a graph that illustrates an output of the voltage detector as a function of varying power supply voltage.

FIG. 8 is a detailed circuit diagram of the voltage detector 125x (one of 1251~1254) shown in FIG. 7. FIG. 9 is a graph that illustrates the features of the comparing voltage Vcomp and the divided voltages Vr12~Vr45 by resistors, as a function of varying power source voltage Vcc. FIG. 10 is a graph that illustrates voltages at the outputs of the voltage detectors 1251~1254, $V_{do1}$~$V_{do4}$, as a function of varying power source voltage Vcc.

Referring to FIG. 8, the voltage detector 125x includes a first input terminal receiving the divided voltage Vrxy (one of Vr12~Vr45) from the voltage divider 127, a second input terminal receiving the comparing voltage Vcomp from the comparing voltage generator 121, and an output terminal from which the reference level control voltage Vdox (one of $V_{do1}$~$V_{do4}$) is applied to the reference level generator 121.

Each voltage detector 125x includes first and second PMOS transistors MP21 and MP22 forming a current mirror loop in which ends of their current paths are connected to the power source voltage Vcc and their control terminals (i.e., gate electrodes) are coupled in common, first and second NMOS transistors MN21 and MN22 whose current paths are connected to the other ends of the current paths of the PMOS transistors MP21 and PM22, a third NMOS transistor MN23 whose current path is commonly connected to the other ends of the current paths of the NMOS transistors MN21 and MN22, and a fourth NMOS transistor MN24 whose current path is connected between the other end of the current path of the third NMOS transistor MN23 and the ground. A control terminal (gate electrode) of the second NMOS transistor MN22 is used as the first input terminal that receives the divided voltage Vrxy, while a control terminal (gate electrode) of the first NMOS transistor MN21 is used as the second input terminal that receives the comparing voltage Vcomp. A contact point of the current paths of the first PMOS and NMOS transistors MP21 and MN21 is used as the output terminal from which the reference level control voltage Vdox is generated.

Referring to FIGS. 8 through 10, the operation of the voltage detector 125x is now described as follows.

First, the second NMOS transistor MN22 of the voltage detector 125x responds to the divided voltage Vrxy, which is provided from the voltage divider 127, through its control terminal (i.e., the first input terminal). When the divided voltage Vrxy set from the power source voltage Vcc is greater than a predetermined voltage, the second NMOS transistor MN22 is turned on to draw a current at a level that corresponds to the divided voltage Vrxy input thereto.

The current flowing through the second NMOS transistor MN22 is transferred to the first PMOS transistor MP21 through the current mirror loop of the first and second PMOS transistors MP21 and MP22, charging the output terminal of the voltage detector 125x. Meantime, the first NMOS transistor MN21 draws a current toward the third and fourth NMOS transistors MN23 and MN24 in response to the comparing voltage Vcomp provided through the second input terminal, discharging the output terminal Vdox. As a result, according to the result of charging and discharging operations at the output terminal (i.e., the result of comparing the divided voltage Vrxy with the comparing voltage Vcomp), the reference level control voltage Vdox is determined.

In FIG. 9, the positions indicated by arrows 1 through 4 represent time points from which the voltage detectors 125x (i.e., 1251~1254) begin to generate the reference level control voltages Vdox (i.e., $V_{do1} \sim V_{do4}$) at a high level. Also, the positions denoted by arrows 1 through 4 in FIG. 10 represent the reference level control voltages Vdox generated from the voltage detectors 125x at the time points indicated by the arrows 1 through 4 in FIG. 9. As can be seen from FIGS. 9 and 10, the reference level control voltages $V_{do1} \sim V_{do4}$ generated by each of the voltage detectors 1251-1254 begin at low levels and rapidly increase up to high levels when the power source voltage Vcc reaches the points denoted by the arrows (i.e., if the divided voltage Vrxy becomes higher than the comparing voltage Vcomp).

As the control terminals of the third and fourth NMOS transistors MN23 and MN24 are coupled to the voltage source voltage Vcc, the transistors MN23 and MN24 remain active. Thus, the third and fourth NMOS transistors MN23 and MN24 operate as current sinks that flow the currents applied thereto, into the ground supply.

As aforementioned, the reference level control voltage Vdox generated by the voltage detector 125x is determined in response to the amount of current that is charged and discharged at the output terminal that is dependent on the divided voltage Vrxy and the comparing voltage Vcomp. For instance, when the divided voltage Vrxy arising from the power source voltage Vcc is lower than the comparing voltage Vcomp, the amount of charge accumulated at the output terminal is less than the amount of charge discharged from the output terminal and thereby the reference level control voltage Vdox is generated at a low level. Otherwise, when the divided voltage Vrxy arising from the power source voltage Vcc is higher than the comparing voltage Vcomp, the amount of charge accumulated at the output terminal is larger than the amount of charge discharged from the output terminal and thus the reference level control voltage Vdox is generated at a high level. As a result, when the power source voltage Vcc is at a relatively higher level, this increases the number of the voltage detectors generating the high-level reference level control voltages, while when the power source voltage Vcc is at a relatively lower level, this increases the number of the voltage detectors generating the low-level reference level control voltages.

Figure 11:
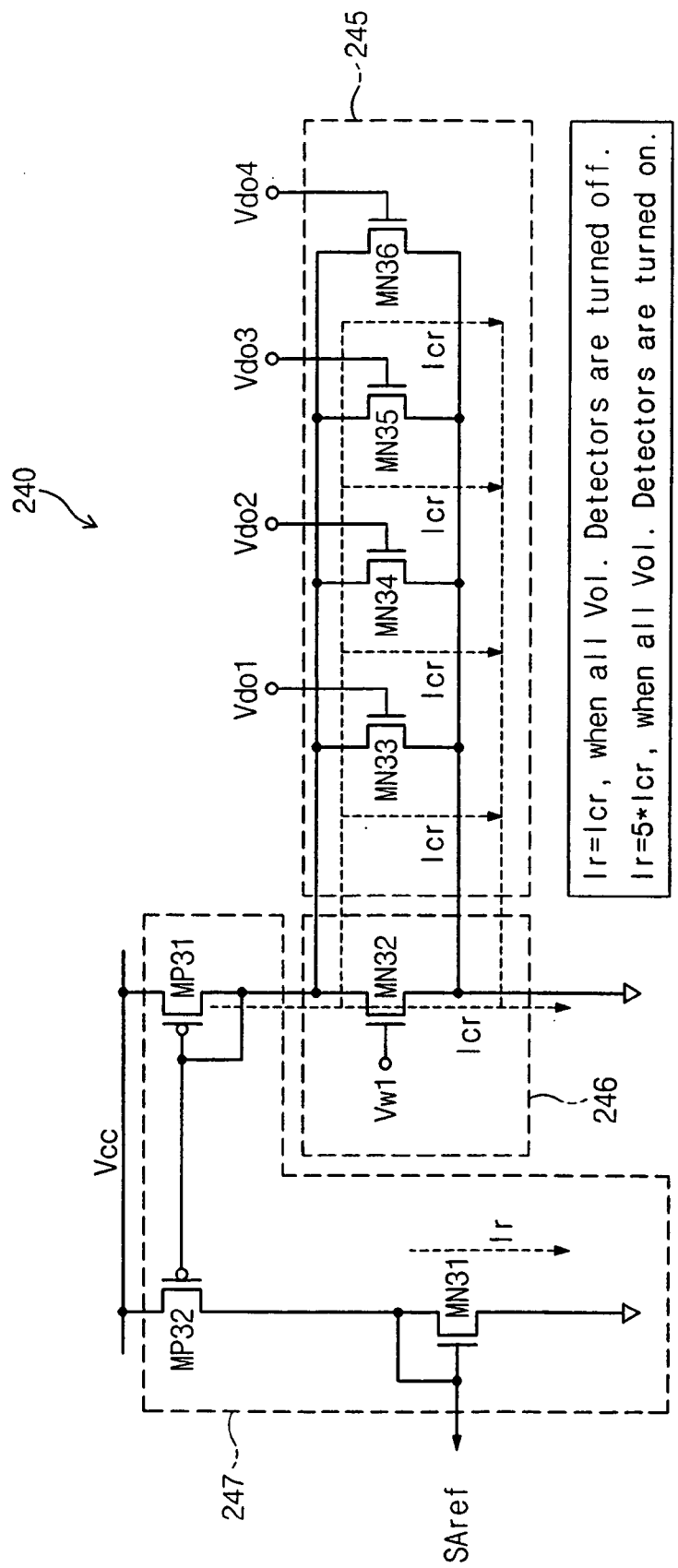
FIG. 11 is a circuit diagram of the reference level generator shown in FIG. 3 in accordance with the present invention.
Figure 12:
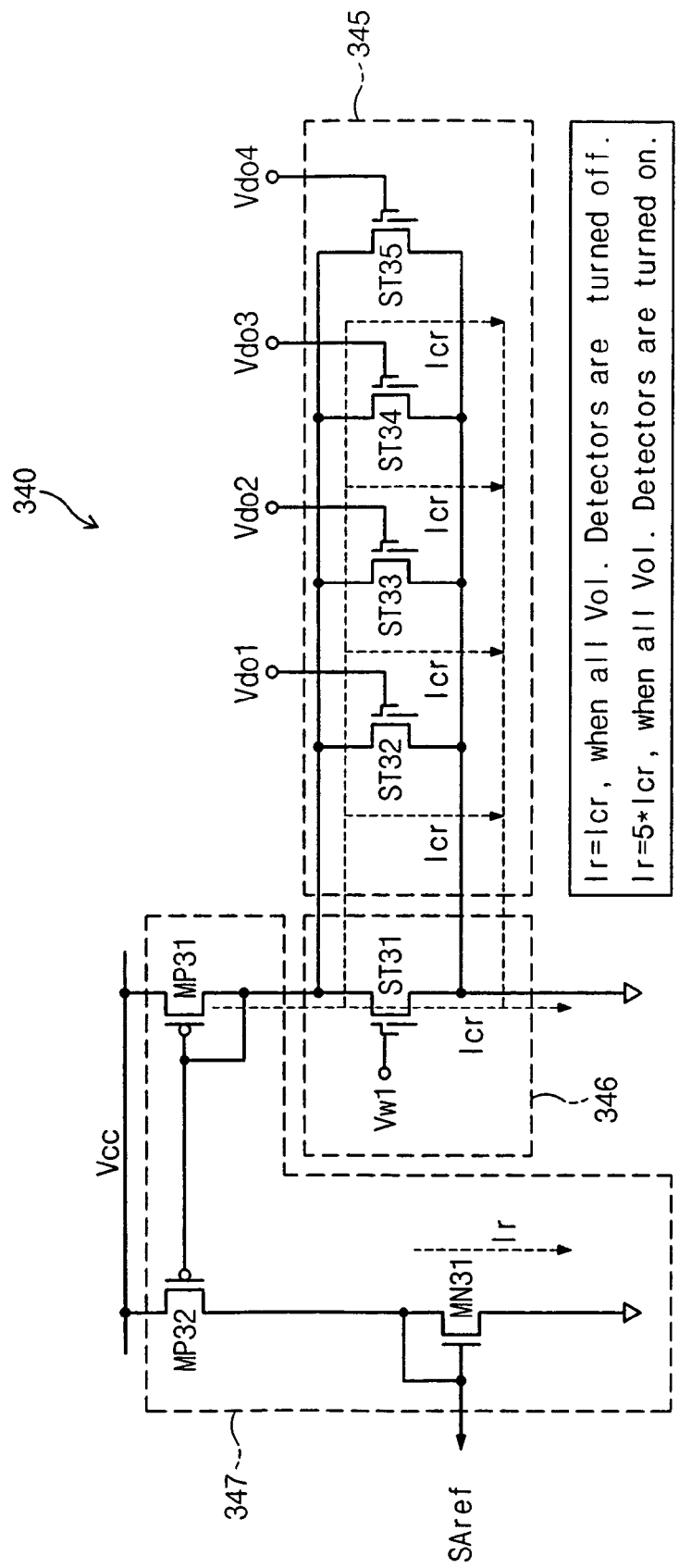
FIG. 12 is a circuit diagram of the reference level generator shown in FIG. 4, in accordance with the present invention.

FIG. 11 is a detailed circuit diagram of the reference level generator 240 shown in FIG. 3 and FIG. 12 is a detailed circuit diagram of the reference level generator 340 shown in FIG. 4. The circuits shown in FIGS. 11 and 12 are examples that are applicable to the case of varying the reference cell current Ir.

The circuit of FIG. 12 is the same construction and operation as that of FIG. 11, with the exception that transistors ST31-ST35 of the reference level generator 340 are flash memory cell type transistors. Detailed operation of the circuit of FIG. 11 is discussed below. Operation of the circuit of FIG. 12 is the same as that of FIG. 11, and is therefore not discussed in detail below.

Referring to FIG. 11, the reference level generator 240 includes a switching unit 245, a reference level generating unit 246, and a reference level output unit 247.

The reference level generating unit 246 outputs a reference current Icr corresponding to the wordline voltage Vw1 of the memory device. The switching unit 245 selectively outputs a plurality of the reference currents Icr, each of which has the same current level as the reference current Icr provided from the reference level generating unit 246, in response to the reference level control voltages $V_{do1} \sim V_{do4}$ provided from the reference level controller 120. The reference level output unit 247 sums the reference currents Icr of the reference level generating unit 246 and the selected ones of the reference currents of the switching unit 245, and then provides the summed reference current Ir to the comparator 290.

For the operation, the reference level output unit 247 includes first and second PMOS transistors MP31 and MP32 whose control terminals (gate electrodes) are coupled in common to form a current mirror loop, and a first NMOS transistor MN31 whose control terminal is coupled to the control terminal of the first NMOS transistor MN1 of the comparator 290 to form a current mirror loop.

The first PMOS transistor MP31 is connected to the power source voltage Vcc through one end of its current path and connected to the reference level generating unit 246 and the switching unit 245 in common through the other end of the current path and its control terminal. The second PMOS transistor MP32 is connected to the power source voltage Vcc through one end of its current path. A control terminal (gate electrode) of the second PMOS transistor MP32 is coupled to the control terminal of the first PMOS transistor MP31 to form a current mirror loop with the first PMOS transistor MP31, through which a sum of currents from the switching unit 245 and the reference level generating unit 246 is output as the reference cell current Ir. The other end of the current path of the second PMOS transistor MP32 is commonly connected to a current path and control terminal of the first NMOS transistor MN31. The first NMOS transistor MN31 transfers the current sum (i.e., the reference cell current Ir) to the comparator 290.

In other words, the first and second PMOS transistors MP31 and MP32 provide the current sum, i.e., the reference cell current Ir, to the first NMOS transistor MN31 by way of the current mirror. And then, the first NMOS transistor MN31 transfers the reference cell current Ir to the first NMOS transistor MN1 of the comparator 290 from the first and second PMOS transistors, MP31 and MP32, through the current mirror loop.

The reference level generating unit 246 has a second NMOS transistor MN32 connected to the other end of the current path of the first PMOS transistor MP31, which is included in the reference level output unit 247, through one end of its current path. The second NMOS transistor MN32 responds to the wordline voltage Vw1 of the memory device through its control terminal (gate electrode), outputting the reference current Icr in correspondence with the wordline voltage Vw1. The reference current Icr flowing through the second NMOS transistor MN32 is used for generating the reference cell current Ir.

The switching unit 245 includes pluralities of switching transistors MN33-MN36 selectively outputting the plural reference currents that have the same level as the reference current Icr supplied by the reference level generating unit 246.

The plural switching transistors MN33~MN36 are connected in parallel, through their current paths, with-the current path of the second NMOS transistor MN32 included in the reference level generating unit 246, and selectively output the plural reference current, which have the same level as the reference current Icr supplied from the second NMOS transistor MN32, in response to the plural control voltages $V_{do1} \sim V_{do4}$ applied through their control terminal (gate electrodes). For instance, each of the switching transistors MN33-MN36 is turned on when the reference level control voltage Vdox is at a high level, outputting the reference current as same as that generated from the second NMOS transistor MN32. Otherwise, each switching transistor is turned off so as not to flow any current therethrough when the reference level control voltage Vdox is a low level.

The reference cell current Ir generated by the reference level output unit 247 is composed of the sum of the reference current Icr of the reference level generating unit 246 and the reference currents of the switching transistors MN33~MN36. For instance, if the switching transistors MN33-MN36 are all turned off, the reference cell current Ir of the switching unit 245 is identical to the reference current Icr generated from the reference level generating unit 246 (i.e., Ir=Icr). If the switching transistors MN33-MN36 are all turned on, the reference cell current Ir of the switching unit 245 is identical to the sum of the reference current Icr of the reference level generating unit 246 and the reference currents of the switching transistors MN33-MN36 (i.e., Ir=Icr+4*Icr=5*Icr).

As stated above, the sense amplifier 200 of the present invention outputs a variable level of the reference cell current Ir in compliance with the control voltages $V_{do1} \sim V_{do4}$ supplied from the voltage detectors 1251~1254. In this case, when the power source voltage Vcc is at a relatively lower level, this causes a fewer of the control voltages $V_{do1} \sim V_{do4}$ to be active, while when the power source voltage Vcc is at a relatively higher level, this causes a larger number of the control voltages $V_{do1} \sim V_{do4}$ to be active. Therefore, as the power source voltage Vcc becomes lower, the reference cell current Ir decreases to enable the on-cell margin to be sufficient. Also, when the power source voltage Vcc is at a high level, the reference cell current Ir is increased to enable the off-cell margin to be sufficient.

Figure 13:
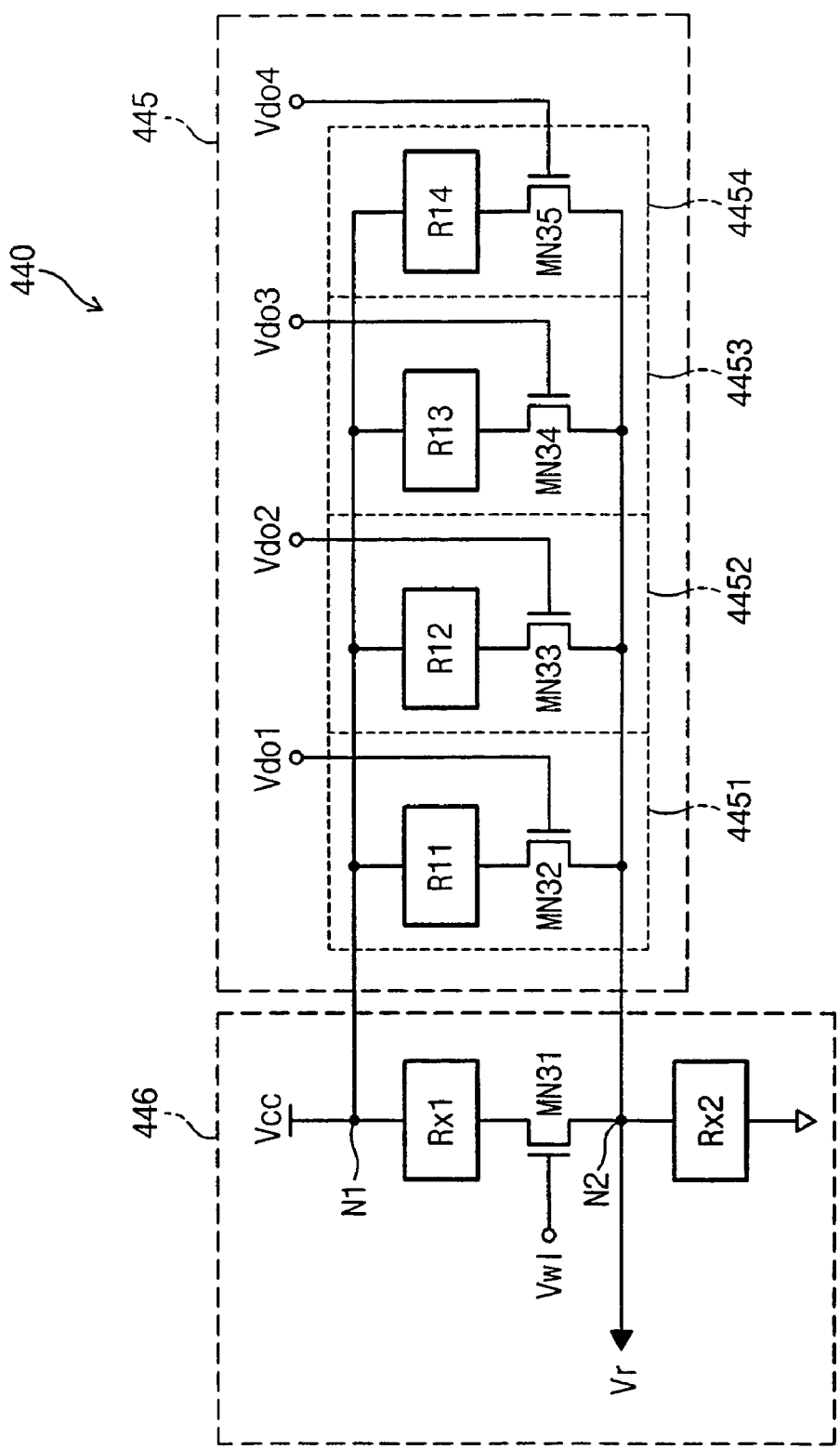
FIG. 13 is a circuit diagram of the reference level generator shown in FIG. 5, in accordance with the present invention.
Figure 14:
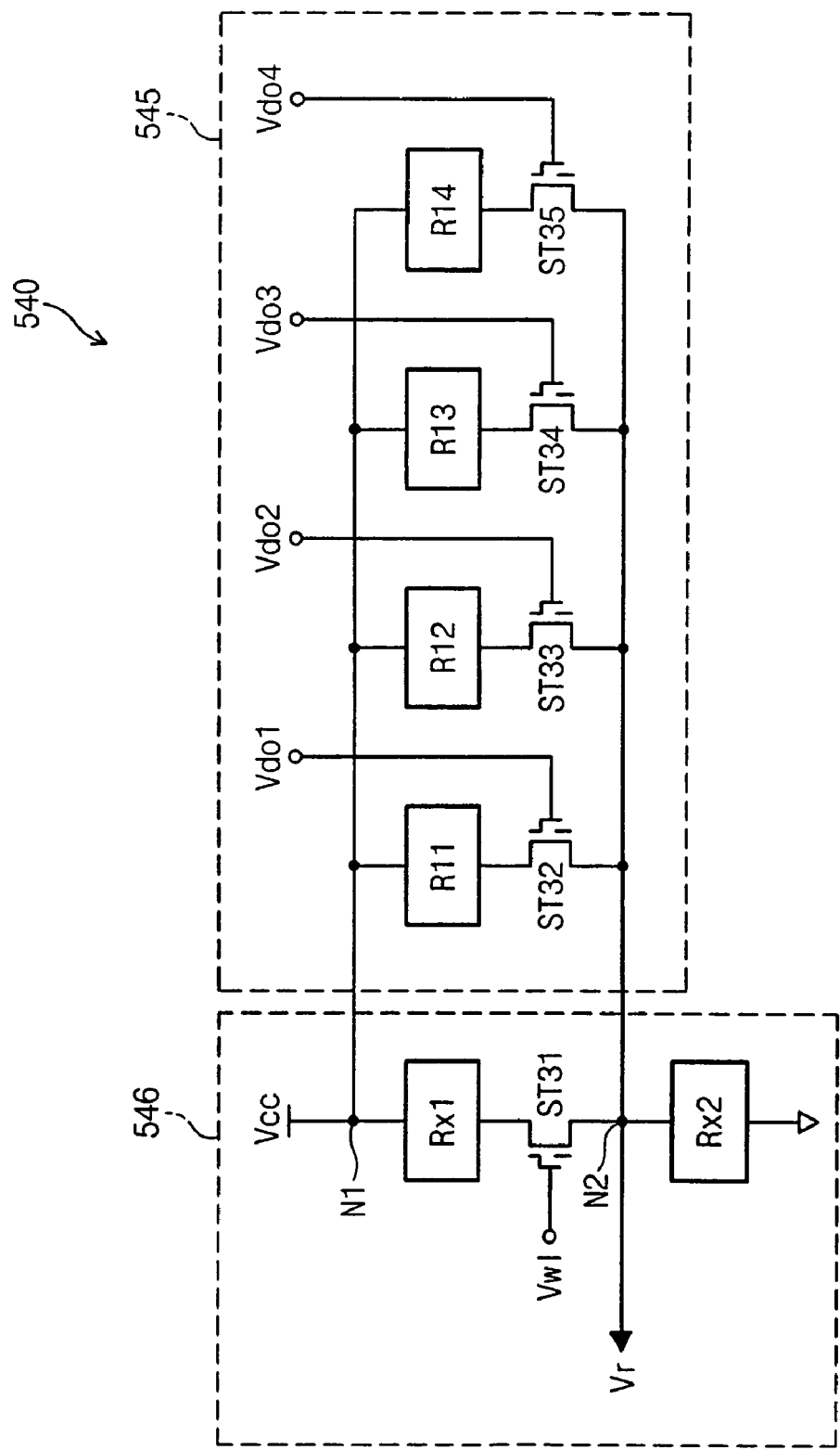
FIG. 14 is a circuit diagram of the reference level generator shown in FIG. 6, in accordance with the present invention.

FIG. 13 is a circuit diagram of the reference level generator 440 shown in FIG. 5. FIG. 14 is a circuit diagram of the reference level generator 540 shown in FIG. 6. The circuits shown in FIGS. 13 and 14 are examples that are applicable to the case of varying the reference cell voltage Vr.

The circuit of FIG. 14 is the same construction and operation with that of FIG. 13, with the exception that transistors ST31-ST35 of the reference level generator 540 are flash memory cell type transistors. Detailed operation of the circuit of FIG. 13 is discussed below. Operation of the circuit of FIG. 14 is the same as that of FIG. 13, and is therefore not discussed in detail below.

Referring to FIG. 13, the reference level generator 440 is comprised of a switching unit 445, a reference level generating unit 446, and a reference level output unit 447.

The reference level generating unit 446 includes a first resistor Rx1, a first NMOS transistor MN31, a second resistor Rx2 that are connected between the power source voltage Vcc and the ground in series. The first NMOS transistor MN31 outputs a voltage, which is divided from the power source voltage Vcc by the first resistor Rx1, as the reference cell voltage Vr.

While the reference cell voltage Vr is basically determined by the values of the first resistor Rx1 and second resistor Rx2, the reference level generator 440 according to the invention further adjusts the reference cell voltage Vr also by utilizing resistors R11, R12, R13, and R14 that are controlled by the switching unit 445, that are in parallel with the first resistor Rx1.

The switching unit 445 includes pluralities of switching circuits 4451-4454 connected in parallel between a first node N1, which is disposed between the power source voltage Vcc and the first resistor Rx1, and a second node N2 that is disposed between the first NMOS transistor MN31 and the second resistor Rx2. Each switching circuit is constructed of a resistor (e.g., R11) and an NMOS transistor (e.g., MN32). The NMOS transistors MN32-MN35 each included in the switching circuits 4451~4454 operate as switches each responding to the control signals $V_{do1} \sim V_{do4}$. For example, if there is a selective input among the reference level control voltages $V_{do1} \sim V_{do4}$ from the reference level controller 120, the NMOS transistors MN32-MN35 are selectively turned on with respect to the reference level control voltage, selectively connecting the resistors R11-R14 in parallel with the first resistor Rx1. Thus, the reference cell voltage Vr output to the comparator 490 is determined by a parallel resistance ratio between the first resistor Rx1 and the resistors R11-R14 of the switching unit 445. As a result, the sense amplifier 400 of the invention outputs a reference cell voltage Vr that is variable in accordance with the control voltages $V_{do1} \sim V_{do4}$ provided by each of the voltage detectors 1251-1254.

Here, if the power source voltage Vcc is decreased to a low level, the number of active control voltages $V_{do1} \sim V_{do4}$ is reduced, in order to reduce the number of resistors coupled in parallel to the first resistor Rx1 of the reference level generating unit 446. As a result, as the power source voltage Vcc is lowered, and the reference cell voltage Vr is reduced to ensure a sufficient on-cell margin. Otherwise, as the power source voltage Vcc is raised to a higher level, the number of the active control voltages $V_{do1} \sim V_{do4}$ is raised, in order to increase the number of resistors coupled in parallel to the first resistor Rx1 of the reference level generating unit 446. As a result, as the power source voltage Vcc is raised, the reference cell voltage Vr is raised to ensure a sufficient off-cell margin.

Figure 15:
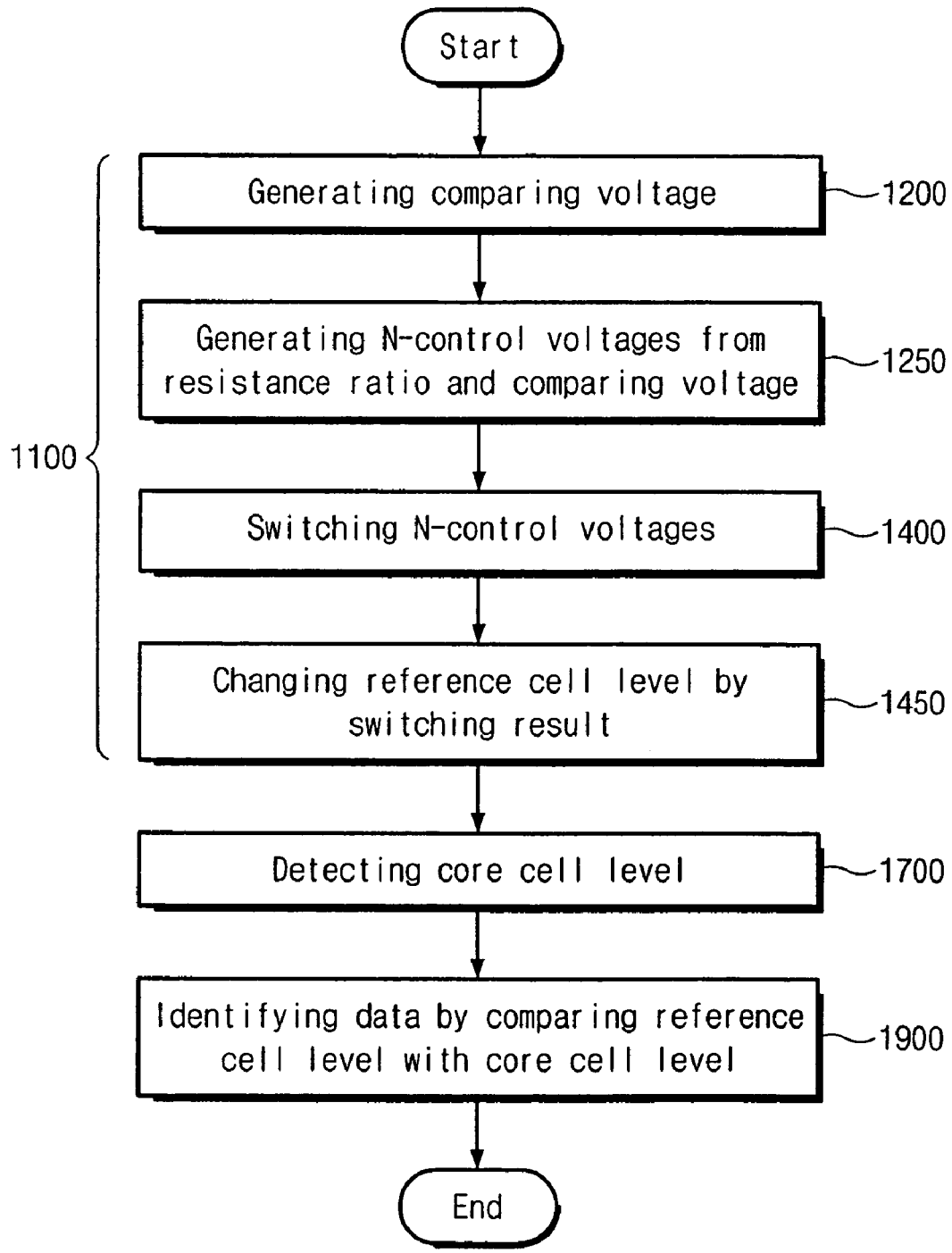
FIG. 15 is a flow diagram illustrating a method of identifying data of the sense amplifier and changing a reference level, in accordance with the present invention.
Figure 16:
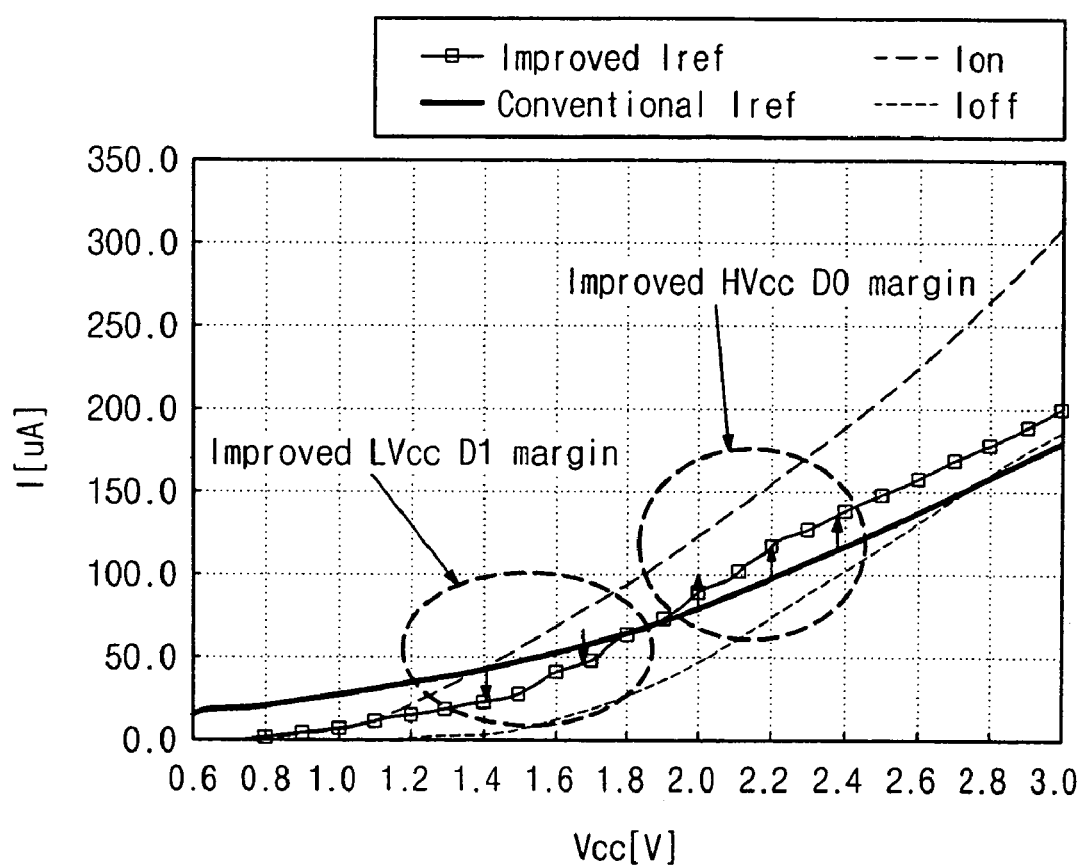
FIG. 16 is a graph illustrating the behavior of the reference current in the sense amplifier according to the invention.
Figure 17:
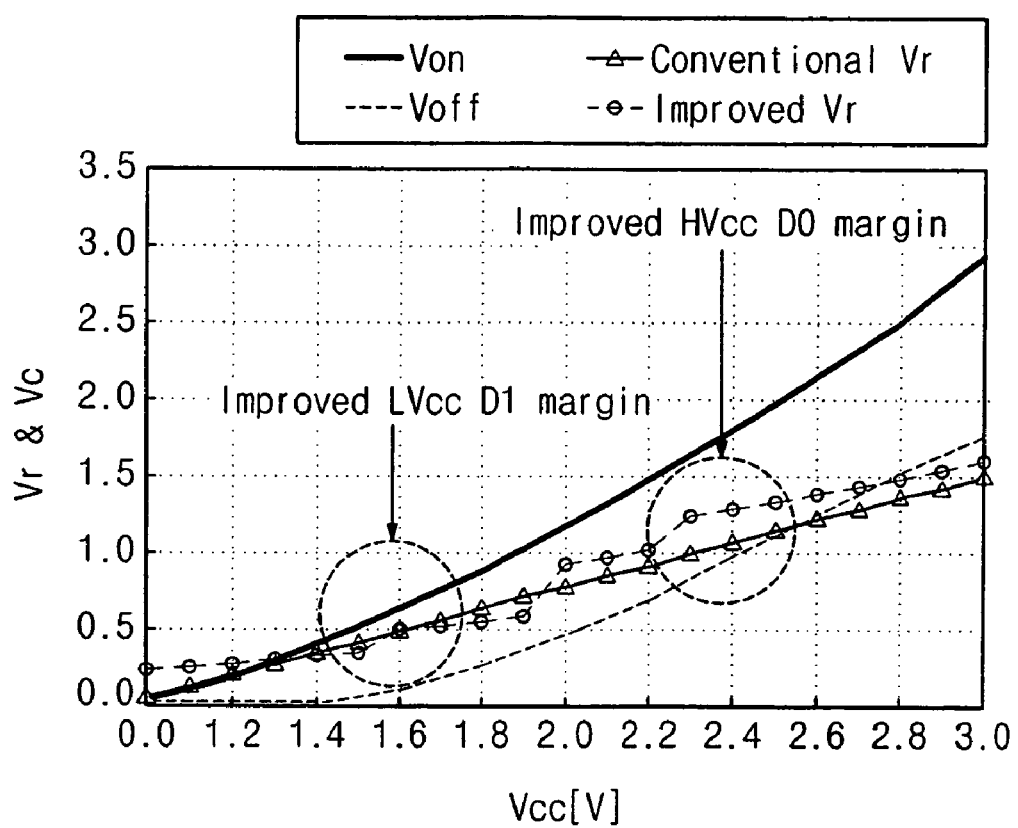
FIG. 17 is a graph illustrating the behavior of reference voltage in the sense amplifier according to the invention.

FIG. 15 is a flow diagram that illustrates a method of identifying data of the sense amplifier and varying the reference level, according to the invention. FIGS. 16 and 17 are graphs that illustrate variation of the reference cell current and voltage, Ir and Vr, in the sense amplifier, as a function of varying power supply voltage Vcc, in accordance with the present invention.

Referring to FIG. 15, first, in order to identify data stored in a core cell, the sense amplifier of the invention, for example one of sense amplifiers 100~500, divides the power source voltage Vcc of the semiconductor memory device into voltages with predetermined resistance ratios by means of the reference cell level control unit, for example, one of 110~510. From the divided voltages Vr12~Vr45 and the comparing voltage Vcomp internally generated in the semiconductor memory device, the reference level, i.e., the reference cell current Ir or the reference cell voltage Vr, is variably generated (step 1100). Next, the core cell level (the core cell current Ic or the core cell voltage Vc) of the semiconductor memory device is detected by way of the core cell level detectors, for example, one of 170~570 (step 1700). Next, data stored in the core cell is identified by comparing the core cell level with the reference level in the comparator, for example one of 190~590 (step 1900).

In detail, the reference cell level control unit, for example one of 110~510, of the sense amplifier generates the comparing voltage Vcomp of a constant level to vary the reference level (step 1200). The reference cell level control unit also generates the reference level control voltages Vdox (i.e., $V_{do1} \sim V_{do4}$) by comparing the divided voltages Vrxy, which are obtained from the power source voltage Vcc with the voltage dividing loop of the plural resistors in predetermined resistance ratios, with the comparing voltage Vcomp (step 1250). Next, the reference cell level control unit selectively switches the plural resistors R11~R14 in response to the reference level control voltages Vdox provided from the reference level controller 120 (step 1400), and modifies the reference level in accordance with a result of the switching operation (step 1450).

As aforementioned, the sense amplifier according to the present invention controls the outputs of the voltage detectors 1251~1254 with reference to the comparing voltage Vcomp that is internally obtained in the semiconductor memory device, and the divided voltages Vr12~Vr45 arising from the power source voltage of the semiconductor memory device in predetermined resistance ratios, and varies the reference level by adjusting the resistance ratios to be applied to the voltage division of the power source voltage Vcc by controlling on/off operations of the plural switching transistors in response to the plural control voltages $V_{do1} \sim V_{do4}$ provided from the voltage detectors 1251~1254.

Consequently, as illustrated in FIGS. 16 and 17, the reference cell current and voltage, Ir and Vr, are relatively lower when the power source voltage Vcc is at a low level, enabling a sufficient on-cell margin. On the other hand, the reference cell current and voltage, Ir and Vr, are relatively higher when the power source voltage Vcc is at a high level, also enabling a sufficient off-cell margin.

While this invention has been particularly shown and described with references to preferred embodiments thereof, it will be understood by those skilled in the art that various changes in form and details may be made herein without departing from the spirit and scope of the invention as defined by the appended claims.

As described above, the sense amplifier and method of sensing data stored in a core cell, according to the present invention, is advantageous to assure a sufficient on-cell margin in cases where the power source voltage is relatively low by means of a lower reference level and assure a sufficient off-cell margin in cases where the power source voltage is relatively high by means of a higher reference level. This feature prevents a read failure of a memory device that would otherwise arise in cases where the voltage margin for sensing is reduced.

What is claimed is:

1. A sense amplifier of a semiconductor memory device, comprising:
    a reference cell level control unit that varies a reference cell level used for identifying data in accordance with a varying of a power source voltage of the semiconductor memory device, ensuring sufficient on-cell and off-cell margins for identifying data regardless of the varying power source voltage, wherein the reference cell level control unit comprises a reference level controller that varies the reference cell level by generating a plurality of reference level control voltages in response to a comparison between a comparing voltage and a plurality of voltages from the power source voltage;
    a core cell level detector that senses a core cell level of the semiconductor memory device; and
    a comparator that identifies data stored in the core cell by comparing the core cell level with the reference cell level.

2. The sense amplifier as set forth in claim 1, wherein the plurality of voltages are divided from the power source voltage according to predetermined resistance ratios, and wherein the reference cell level control unit further comprises a reference level generator selectively switching a plurality of reference currents in response to the plurality of reference level control voltages and generating a reference cell current in response to a sum of the reference currents.

3. The sense amplifier as set forth in claim 2, wherein the reference cell level control unit reduces the reference cell current to increase a gap between the reference cell current and an on-cell current when the power source voltage decreases below the comparing voltage, and increases the reference cell current to increase a gap between the reference cell current and an off-cell current when the power source voltage rises above the comparing voltage.

4. The sense amplifier as set forth in claim 2, wherein the reference level controller comprises:
    a comparing voltage generator outputting the comparing voltage at a constant level derived from the varying power source voltage;
    a voltage divider providing the plurality of divided voltages according to the predetermined resistance ratios from the varying power source voltage by means of plural resistors connected between the power source voltage and a ground; and
    a control voltage generator outputting each of the plurality of reference level control voltages when the corresponding divided voltage is higher than the comparing voltage.

5. The sense amplifier as set forth in claim 4, wherein the control voltage generator comprises a plurality of comparing units for comparing the divided voltages with the comparing voltage.

6. The sense amplifier as set forth in claim 4, wherein the control voltage generator increases the number of activated reference level control voltages when the divided voltage is higher than the comparing voltage, and decreases the number of activated reference level control voltages when the divided voltage is lower than the comparing voltage.

7. The sense amplifier as set forth in claim 2, wherein the reference level generator comprises:
    a reference current generating unit generating a first reference current used as a reference in generating the reference cell current;
    a switching unit selectively outputting a plurality of second reference currents, that are used for varying the reference cell current, in response to the plurality of reference level control voltages supplied from the reference level controller; and a reference level output unit providing a sum of the first and second reference cell currents as the reference cell level to the comparator.

8. The sense amplifier as set forth in claim 7, wherein the first reference current and each of the plurality of second reference currents have the same level as each other.

9. The sense amplifier as set forth in claim 7, wherein the switching unit comprises a plurality of switching transistors selectively driving plurality of the second reference currents in response to the plurality of reference level control voltages.

10. The sense amplifier as set forth in claim 9, wherein each of the switching transistors has the same operation characteristic as the core cell of the semiconductor memory device.

11. The sense amplifier as set forth in claim 10, wherein each of the switching transistors is one of NMOS and PMOS transistors.

12. The sense amplifier as set forth in claim 10, wherein the switching transistors are flash memory cell transistors.

13. The sense amplifier as set forth in claim 1, wherein the reference cell level control unit comprises the reference level controller generating a plurality of voltages divided from the power source voltage according to predetermined resistance ratios; and a reference level generator selectively connecting a plurality of resistors in response to the plurality of reference level control voltages and generating a reference cell voltage by dividing the power source voltage by the combined resistance value of the resistors that are selectively connected.

14. The sense amplifier as set forth in claim 13, wherein the reference cell level control unit reduces the reference cell voltage to increase a gap between the reference cell current and an on-cell current when the power source voltage decreases below the comparing voltage, and increases the reference cell voltage to increase a gap between the reference cell current and an off-cell current when the power source voltage rises above the comparing voltage.

15. The sense amplifier as set forth in claim 13, wherein the reference level controller comprises:

a comparing voltage generator outputting the comparing voltage at a constant level derived from the varying power source voltage;

a voltage divider providing the plurality of divided voltages according to the predetermined resistance ratios from the varying power source voltage by means of plural resistors connected between the power source voltage and a ground; and a control voltage generator outputting each of the plurality of reference level control voltages when the corresponding divided voltage is higher than the comparing voltage.

16. The sense amplifier as set forth in claim 15, wherein the control voltage generator comprises a plurality of comparing units for comparing the divided voltages with the comparing voltage.

17. The sense amplifier as set forth in claim 15, wherein the control voltage generator increases the number of activated reference level control voltages when the divided voltage is higher than the comparing voltage, and decreases the number of activated reference level control voltages when the divided voltage is lower than the comparing voltage.

18. The sense amplifier as set forth in claim 13, wherein the reference level generator comprises:

a reference voltage generating unit including a first output resistor; and a switching unit selectively connecting plural second output resistors in parallel with the first output resistor in response to the plurality of reference level control voltages supplied from the reference level controller, wherein the reference cell voltage is generated by dividing the power source voltage with the combined resistance value of the first output resistor and the plurality of active second output resistors.

19. The sense amplifier as set forth in claim 18, wherein the switching unit comprises a plurality of switching transistors selectively connecting the plurality of second output resistors in parallel with the first output resistor in response to the plurality of reference level control voltages.

20. The sense amplifier as set forth in claim 19, wherein each of the switching transistors has the same operation characteristic as the core cell of the semiconductor memory device.

21. The sense amplifier as set forth in claim 20, wherein each of the switching transistors is one of NMOS and PMOS transistors.

22. The sense amplifier as set forth in claim 20, wherein the switching transistors are flash memory cell transistors.

23. A method of sensing data in a semiconductor memory device, comprising the steps of:

(a) varying a reference cell level to be used for identifying data in accordance with a varying power source voltage of the semiconductor memory device by generating a plurality of reference level control voltages in response to a comparison between a comparing voltage and a plurality of voltages from the power source voltage, to ensure sufficient on-cell and off-cell margins for identifying data regardless of the varying power source voltage;

(b) sensing a core cell level of the semiconductor memory device; and (c) identifying data stored in the core cell by comparing the core cell level with the reference cell level.

24. The method as set forth in claim 23, wherein the step (a) comprises the steps of:

(a-1) generating the comparing voltage at a constant level from the varying power source voltage; (a-2) comparing the plurality of voltages, which are obtained by dividing the power source voltage according to predetermined resistance ratios by a plurality of resisters, with the comparing voltage and generating the plurality of reference level control voltages in response to a comparing result;

(a-3) switching a plurality of reference currents in response to the plurality of reference level control voltages; and (a-4) generating a reference cell current in response to a combination of the switched reference currents.

25. The method as set forth in claim 24, wherein in the step (a-3), the number of activated reference currents decreases when the power source voltage decreases below the comparing voltage, while the number of activated reference currents increases, when the power source voltage rises above the comparing voltage.

26. The method as set forth in claim 24, wherein in the step (a-3), the switched reference current is generated from a transistor that has the same operating characteristic as that of the core cell.

27. The method as set forth in claim 23, wherein in the step (a), a reference cell current decreases to increase a gap between the reference cell current and an on-cell current when the power source voltage decreases below the comparing voltage, and the reference cell current increases to increase a gap between the reference cell current and an off-cell current when the power source voltage rises above the comparing voltage.

28. The method as set forth in claim 23, wherein the step (a) comprises the steps of:
  (a-1) generating the comparing voltage at a constant level from the varying power source voltage;
  (a-2) dividing the power source voltage into divided voltages using predetermined resistance ratios by a plurality of resistors;
  (a-3) comparing the divided voltages with the comparing voltage and generating the plurality of reference level control voltages in response to the comparing result;
  (a-4) selectively connecting a plurality of output resistors in response to the plurality of reference level control voltages; and
  (a-5) generating a reference cell current by dividing the power source voltage by the combined resistance ratio of the output resistors.

29. The method as set forth in claim 28, wherein in the step (a-4), the combined resistance of the output resistors increases when the power source voltage decreases below the comparing voltage, and the combined resistance of the output resistor decreases when the power source voltage increases above the comparing voltage.

30. The method as set forth in claim 28, wherein in the step (a), a reference cell voltage decreases to increase a gap between the reference cell voltage and an on-cell current when the power source voltage decreases below the comparing voltage, while increases to increase a gap between the reference cell voltage and an off-cell current when the power source voltage rises above the comparing voltage.

31. A method of generating a reference level to identify data stored in a core cell of a semiconductor memory device by comparing a reference cell current with a core cell current, the method comprising the steps of:
  (a) generating a plurality of reference level control voltages in response to a comparison between a comparing voltage generated from a power source voltage of the semiconductor memory device and voltages divided from the power source voltage according to predetermined resistance ratios; and
  (b) switching a plurality of reference currents in response to the reference level control voltages and generating the reference cell current in response to a combination of the switched reference currents.

32. A method of generating a reference level to identify data stored in a core cell of a semiconductor memory device by comparing a reference cell voltage with a core cell voltage, the method comprising the steps of:
  (a) generating a plurality of reference level control voltages in response to a comparison between a comparing voltage generated from a power source voltage of the semiconductor memory device and voltages divided from the power source voltage according to predetermined resistance ratios; and
  (b) adjusting a resistance value of an output resistor in response to the reference level control voltages and generating the reference cell voltage in response to the adjusted resistance value.

33. A method of generating a reference level to identify data stored in a core cell of a semiconductor memory device by comparing a reference cell current with a core cell current, the method comprising the steps of:
  (a) generating a comparing voltage at a constant level from a varying power source voltage of the semiconductor memory device;
  (b) dividing the power source voltage according to predetermined resistance ratios by a plurality of resistors, and generating a plurality of reference level control voltages in response to a comparison between the comparing voltage and the divided voltages;
  (c) switching a plurality of reference currents in response to the reference level control voltages; and
  (d) generating the reference cell current in response to a combination of the switched reference currents.

34. A method of generating a reference level to identify data stored in a core cell of a semiconductor memory device by comparing a reference cell voltage with a core cell voltage, the method comprising the steps of:
  (a) generating a comparing voltage at a constant level from a varying power source voltage of the semiconductor memory device;
  (b) dividing the power source voltage according to predetermined resistance ratios by a plurality of resistors, and generating a plurality of reference level control voltages in response to a comparison between the comparing voltage and the divided voltages;
  (c) selectively connecting a plurality of output resistors in response to the reference level control voltages; and
  (d) generating the reference cell voltage by dividing the power source voltage by the combined resistance of the output resistors.

* * * * *

UNITED STATES PATENT AND TRADEMARK OFFICE
CERTIFICATE OF CORRECTION

PATENT NO. : 7,283,413 B2 Page 1 of 1
APPLICATION NO. : 11/076788
DATED : October 16, 2007
INVENTOR(S) : Jeong-Un Choi et al.

It is certified that error appears in the above-identified patent and that said Letters Patent is hereby corrected as shown below:

Column 18, line 49 delete "resisters" and insert --resistors--

Signed and Sealed this

Twenty-second Day of July, 2008

JON W. DUDAS
*Director of the United States Patent and Trademark Office*